(12) United States Patent
Zampardi et al.

(10) Patent No.: US 10,629,711 B2
(45) Date of Patent: Apr. 21, 2020

(54) SEMICONDUCTOR DEVICE WITH MULTIPLE HBTS HAVING DIFFERENT EMITTER BALLAST RESISTANCES

(71) Applicant: Qorvo US, Inc., Greensboro, NC (US)

(72) Inventors: Peter J. Zampardi, Newbury Park, CA (US); Brian G. Moser, Jamestown, NC (US); Thomas James Rogers, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/512,721

(22) Filed: Jul. 16, 2019

(65) Prior Publication Data

US 2019/0341477 A1    Nov. 7, 2019

Related U.S. Application Data

(62) Division of application No. 16/182,898, filed on Nov. 7, 2018, now Pat. No. 10,418,468, which is a division
(Continued)

(51) Int. Cl.
*H01L 21/00* (2006.01)
*H01L 29/737* (2006.01)
(Continued)

(52) U.S. Cl.
CPC ........ *H01L 29/737* (2013.01); *H01L 21/8252* (2013.01); *H01L 23/5228* (2013.01); *H01L 25/072* (2013.01); *H01L 25/50* (2013.01); *H01L 27/0605* (2013.01); *H01L 27/0772* (2013.01); *H01L 27/0825* (2013.01);
(Continued)

(58) Field of Classification Search
CPC .............. H01L 29/737; H01L 29/7371; H01L 29/0817; H01L 29/66242; H01L 21/8252
See application file for complete search history.

(56) References Cited

U.S. PATENT DOCUMENTS

| | | |
|---|---|---|
| 5,552,617 A | 9/1996 | Hill et al. |
| 5,648,294 A | 7/1997 | Bayraktaroglu |
| (Continued) | | |

OTHER PUBLICATIONS

Notice of Allowance for U.S. Appl. No. 15/236,974, dated Oct. 12, 2017, 8 pages.
(Continued)

*Primary Examiner* — Douglas M Menz
(74) *Attorney, Agent, or Firm* — Withrow & Terranova, P.L.L.C.

(57) ABSTRACT

The present disclosure relates to a semiconductor device with multiple heterojunction bipolar transistors (HBTs) that have different emitter ballast resistances. The disclosed semiconductor device includes a substrate, a first HBT and a second HBT formed over the substrate. The first HBT includes a first collector, a first base over the first collector, a first emitter over the first base, and a first cap structure over the first emitter. The second HBT includes a second collector, a second base over the second collector, a second emitter over the second base, and a second cap structure over the second emitter. Herein, the first cap structure is different from the second cap structure, such that a first emitter ballast resistance from the first cap structure is at least 1.5 times greater than a second emitter ballast resistance from the second cap structure.

10 Claims, 14 Drawing Sheets

Related U.S. Application Data of application No. 15/906,337, filed on Feb. 27, 2018, now Pat. No. 10,170,602, which is a division of application No. 15/236,974, filed on Aug. 15, 2016, now Pat. No. 9,905,678.

(60) Provisional application No. 62/296,128, filed on Feb. 17, 2016.

(51) Int. Cl.

| | | |
|---|---|---|
| *H01L 25/07* | (2006.01) | |
| *H01L 29/08* | (2006.01) | |
| *H01L 23/522* | (2006.01) | |
| *H01L 25/00* | (2006.01) | |
| *H01L 29/66* | (2006.01) | |
| *H01L 21/8252* | (2006.01) | |
| *H01L 29/417* | (2006.01) | |
| *H01L 27/06* | (2006.01) | |
| *H01L 27/07* | (2006.01) | |
| *H01L 27/082* | (2006.01) | |

(52) U.S. Cl.
CPC .... *H01L 29/0817* (2013.01); *H01L 29/41708* (2013.01); *H01L 29/66242* (2013.01); *H01L 29/66318* (2013.01); *H01L 29/7371* (2013.01)

(56) References Cited

U.S. PATENT DOCUMENTS

| | | | |
|---|---|---|---|
| 5,864,169 A | 1/1999 | Shimura et al. | |
| 6,043,520 A | 3/2000 | Yamamoto et al. | |
| 6,465,804 B1 | 10/2002 | Shamir et al. | |
| 6,611,008 B2 | 8/2003 | Twynam et al. | |
| 6,661,037 B2 | 12/2003 | Pan et al. | |
| 6,768,140 B1 | 7/2004 | Hong et al. | |
| 7,256,434 B2 | 8/2007 | Ohbu et al. | |
| 7,564,117 B2 | 7/2009 | Beason | |
| 7,687,886 B2 | 3/2010 | Pan et al. | |
| 7,741,700 B2 | 6/2010 | Kuroda et al. | |
| 7,960,758 B2 | 6/2011 | Maeda | |
| 8,912,631 B2 | 12/2014 | Pan et al. | |
| 8,987,782 B2 | 3/2015 | Ichikawa | |
| 9,041,472 B2 | 5/2015 | Chen et al. | |
| 9,105,488 B2 | 8/2015 | Zampardi, Jr. et al. | |
| 9,105,604 B2 | 8/2015 | Hacker | |
| 9,130,004 B2 | 9/2015 | Obu et al. | |
| 9,356,127 B2 | 5/2016 | Tsai et al. | |
| 9,608,084 B2 | 3/2017 | Henderson et al. | |
| 9,755,592 B2 | 9/2017 | Zampardi, Jr. et al. | |
| 9,761,678 B2 | 9/2017 | Moser et al. | |
| 9,768,282 B2 | 9/2017 | Zampardi, Jr. | |

OTHER PUBLICATIONS

Hayes, D. G. et al., "Integration of a Superlattice Limiter into the HBT Emitter for Improved Operational Reliability," IEEE Electron Devices Letters, vol. 21, No. 5, May 2000, pp. 203-205.

Peng, C. K. et al., "Extremely low resistance nonalloyed ohmic contacts on GaAs using InAs/InGaAs and InAs/GaAs strained-layer superlattices," Applied Physics Letters, vol. 53, No. 10, Sep. 5, 1988, pp. 900-901.

Twynam, J. K. et al., "Thermal Stabilization of AlGaAs/GaAs Power HBTs Using n-AlxGa1—xAs Emitter Ballast Resistors With High Thermal Coefficient of Resistance," Solid-State Electronics, vol. 38, No. 9, Sep. 1995, pp. 1657-1661.

Wang, Y. et al., "Novel heterojunction bipolar transistors (HBTs) with significantly reduced emitter current crowding affect," 1998 5th International Conference on Solid-State and Integrated Circuit Technology Proceedings, 1998, pp. 583-586.

Notice of Allowance for U.S. Appl. No. 15/906,337, dated Aug. 16, 2018, 8 pages.

Notice of Allowance for U.S. Appl. No. 16/182,898, dated Apr. 18, 2019, 7 pages.

SEMICONDUCTOR DEVICE WITH MULTIPLE HBTS HAVING DIFFERENT EMITTER BALLAST RESISTANCES

RELATED APPLICATIONS

This application claims priority to and is a divisional application of U.S. patent application Ser. No. 16/182,898, filed Nov. 7, 2018, now patented as U.S. Pat. No. 10,418,468, which is a divisional application of U.S. patent application Ser. No. 15/906,337, filed Feb. 27, 2018, now U.S. Pat. No. 10,170,602, which is a divisional of U.S. patent application Ser. No. 15/236,974, filed Aug. 15, 2016, now U.S. Patent No. 9,905,678, which claims the benefit of provisional patent application Ser. No. 62/296,128, filed Feb. 17, 2016, the disclosures of which are hereby incorporated herein by reference in their entireties.

FIELD OF THE DISCLOSURE

The present disclosure relates to a semiconductor device with multiple heterojunction bipolar transistors (HBTs) and more particularly to a semiconductor device with multiple HBTs that have different emitter ballast resistances for improved thermal stability performance.

BACKGROUND

Transistors are an essential component in modern mobile communications devices. Specifically, transistors play a vital role in the transmission and reception of radio frequency (RF) signals in the front end of a mobile communications device. Due to the decreasing form factor of mobile communications devices, the desire for a longer battery life, and support for an increasing number of stringent wireless communications standards, there is an ongoing need for smaller, more efficient transistor devices with improved performance characteristics.

As will be appreciated by those of ordinary skill in the art, one way to improve the performance at high frequencies (e.g., radio frequencies) is by using heterojunction bipolar transistors (HBTs). At high frequencies, HBTs offer many performance advantages over homojunction bipolar transistors. The performance advantages offered by conventional HBTs primarily arise due to a wider energy bandgap in the material of the emitter of the device as compared to the energy bandgap in the material of the base of the device. The wider energy bandgap of the emitter material allows for many parameters dictating the performance of the device to be optimized for high frequencies without degrading the current gain of the device.

For high power applications, multiple HBTs may be integrated into one semiconductor circuit to accommodate high currents as shown in FIG. 1. In some conditions, one of the HBTs, like HBT1, may run hotter than the other HBTs, and draw more current resulting in thermal runaway. One solution to provide good thermal stability for HBT1-HBTn is to apply emitter ballast resistors R1-Rn in series with HBT1-HBTn, respectively. These emitter ballast resistors R1-Rn may be provided by conventional thin film resistors, which may, however, significantly increase the size of the semiconductor circuit. Further, for some packaging technology, like flip-chip technology, emitters e1-en of the HBT1-HBTn will be connected together (not shown), which basically shorts out the emitter ballast resistors R1-Rn. As such, the HBT1-HBTn will not have different emitter ballast resistors to improve the thermal stability of the device.

Accordingly, there remains a need for improved semiconductor device designs to utilize the advantages of HBTs while achieving structure flexibilities such that HBTs may have different emitter ballast resistances for improved thermal stability performance. In addition, there is also a need to keep the size and cost of the final products effective.

SUMMARY

The present disclosure relates to a semiconductor device with multiple heterojunction bipolar transistors (HBTs) that have different emitter ballast resistances for improved thermal stability performance. The disclosed semiconductor device includes a substrate, a first HBT, and a second HBT formed over the substrate. The first HBT includes a first collector, a first base formed over the first collector, a first emitter formed over the first base, a first cap structure formed over the first emitter, and a first emitter contact connected to the first cap structure. The second HBT includes a second collector, a second base formed over the second collector, a second emitter formed over the second base, a second cap structure formed over the second emitter, and a second emitter contact connected to the second cap structure. Herein, the first cap structure is different from the second cap structure, such that a first emitter ballast resistance from the first cap structure between the first emitter contact and the first emitter is at least 1.5 times greater than a second emitter ballast resistance from the second cap structure between the second emitter contact and the second emitter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
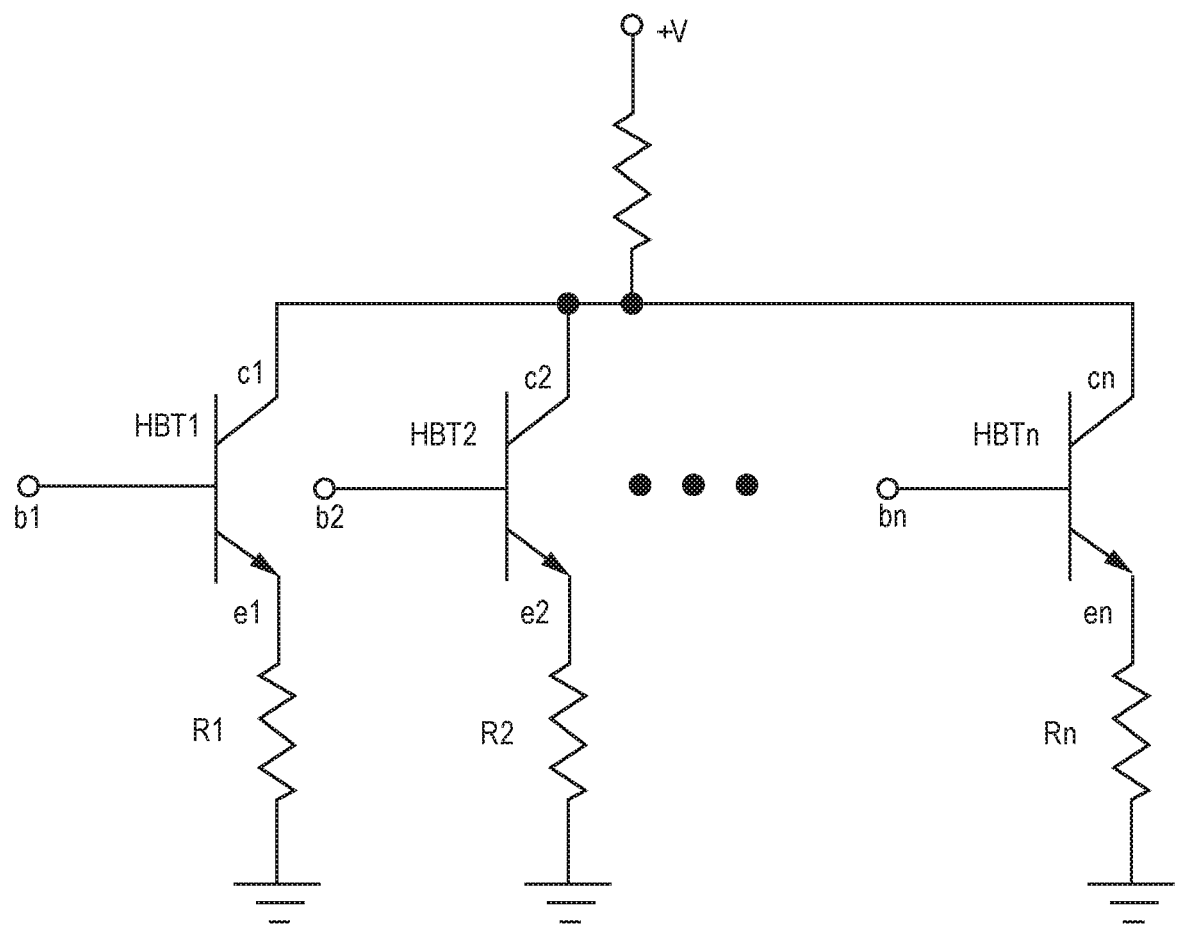
FIG. 1 shows multiple paralleling heterojunction bipolar transistors (HBTs) with emitter ballast resistors.
Figure 2:
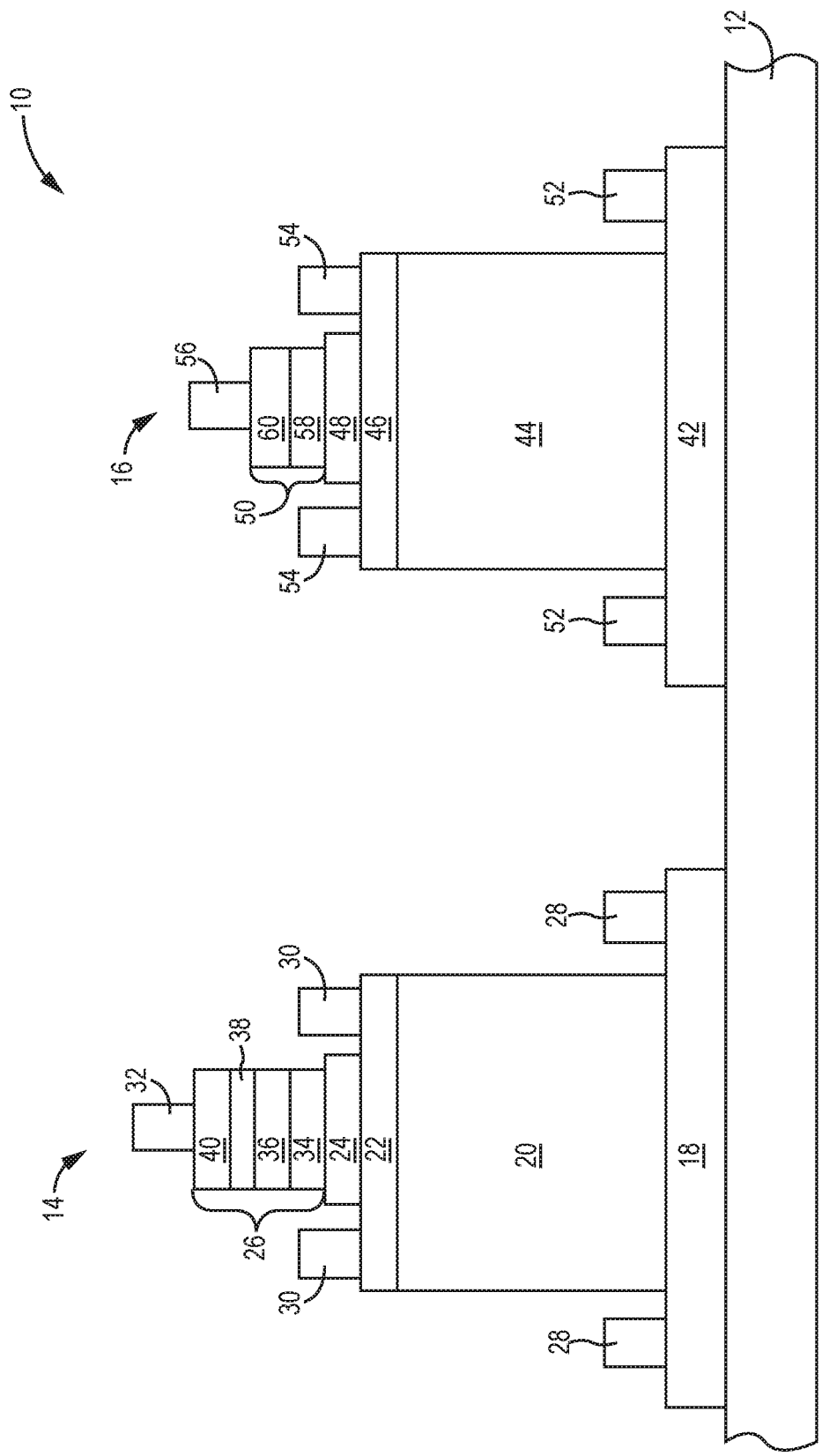
FIG. 2 shows an exemplary semiconductor device with multiple HBTs that have different emitter ballast resistances according to one embodiment of the present disclosure.
Figure 5A:
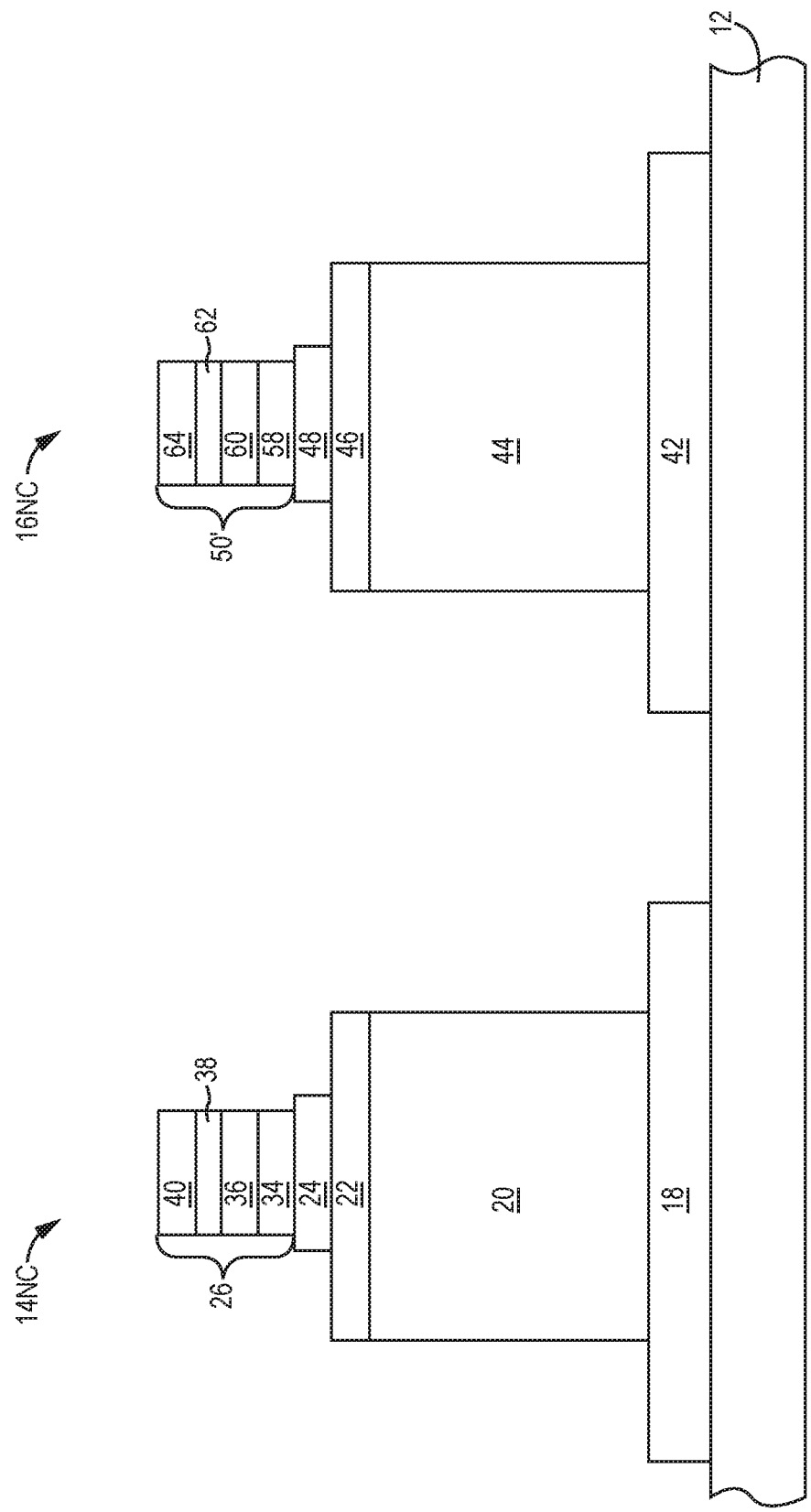
Figure 5B:
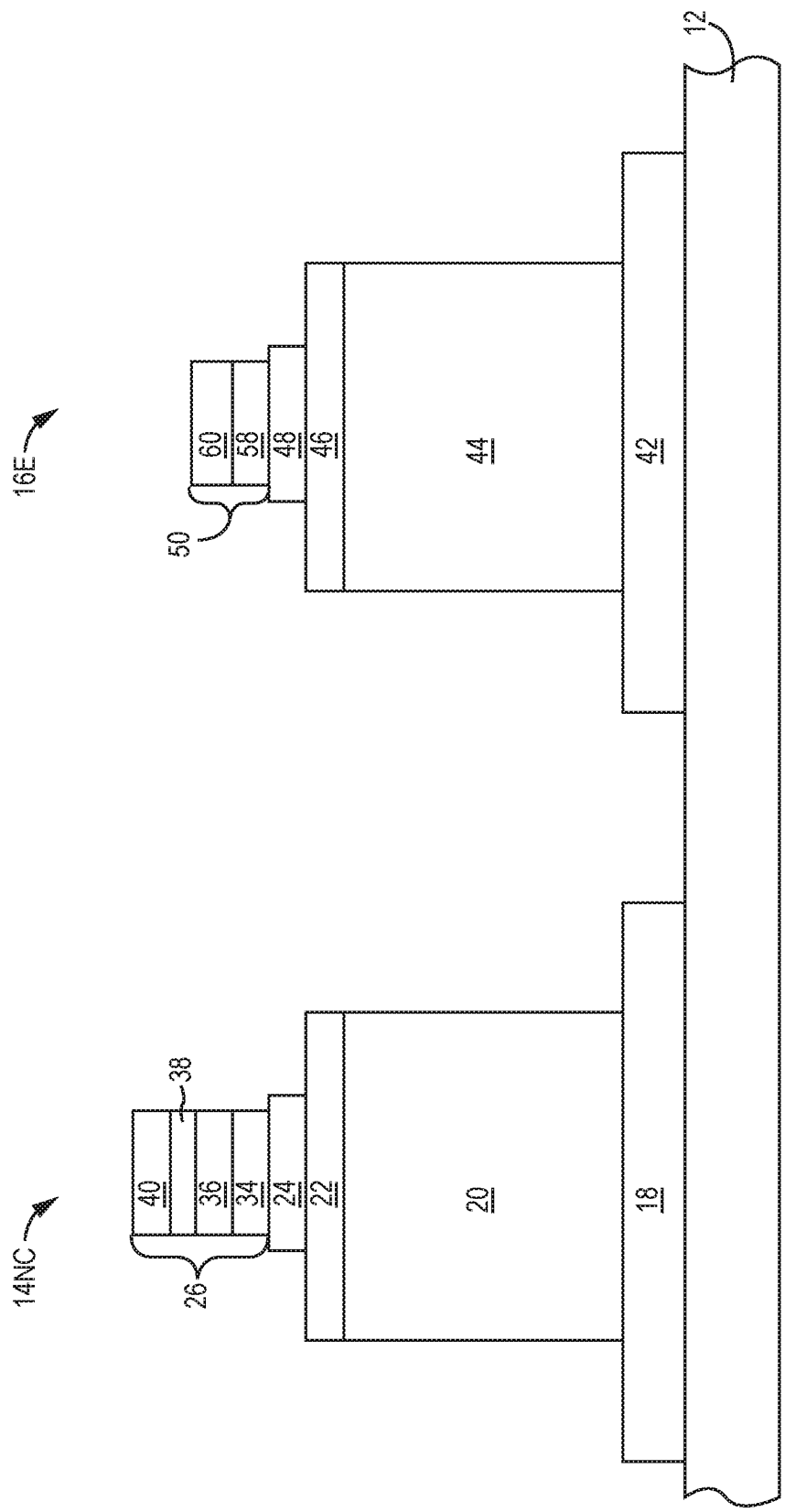
Figure 5C:
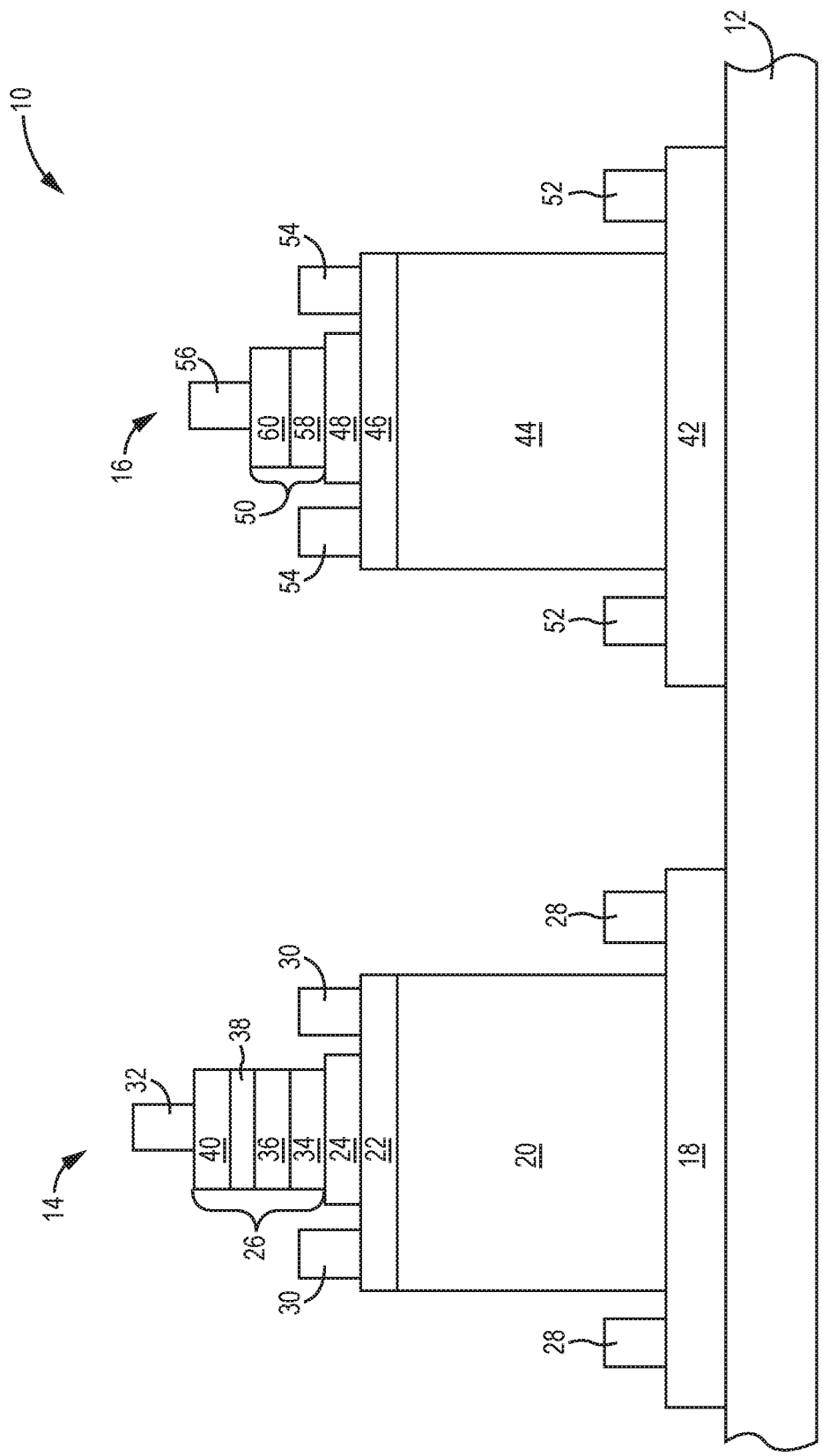

FIGS. 5A-5C provide exemplary steps that illustrate a process to fabricate the exemplary semiconductor device shown in FIG. 2.

Figure 3:
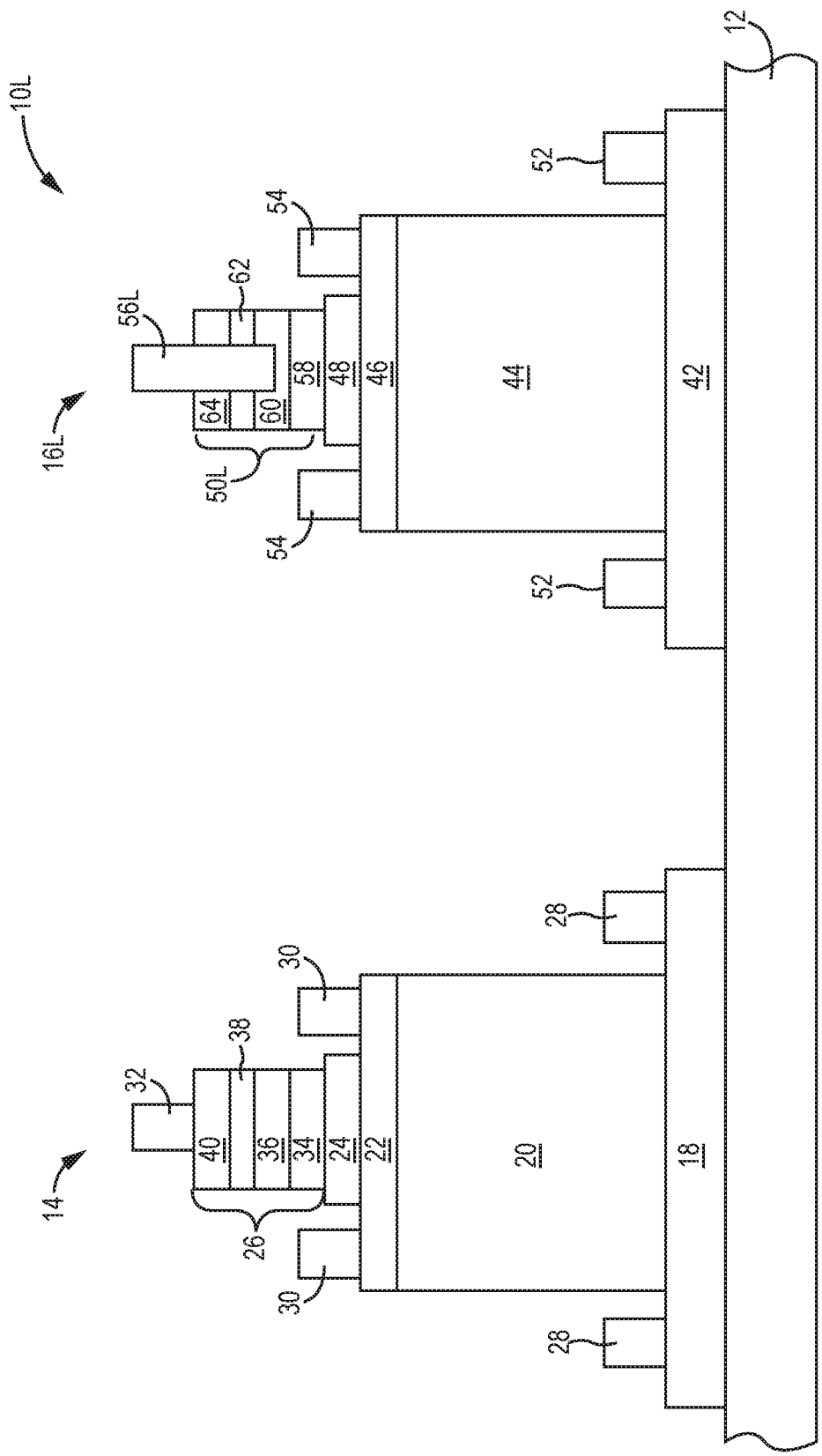
FIG. 3 shows an exemplary semiconductor device with multiple HBTs that have different emitter ballast resistances according to one embodiment of the present disclosure.

FIGS. 6A-6D provide exemplary steps that illustrate a process to fabricate the exemplary semiconductor device shown in FIG. 3.

Figure 4:
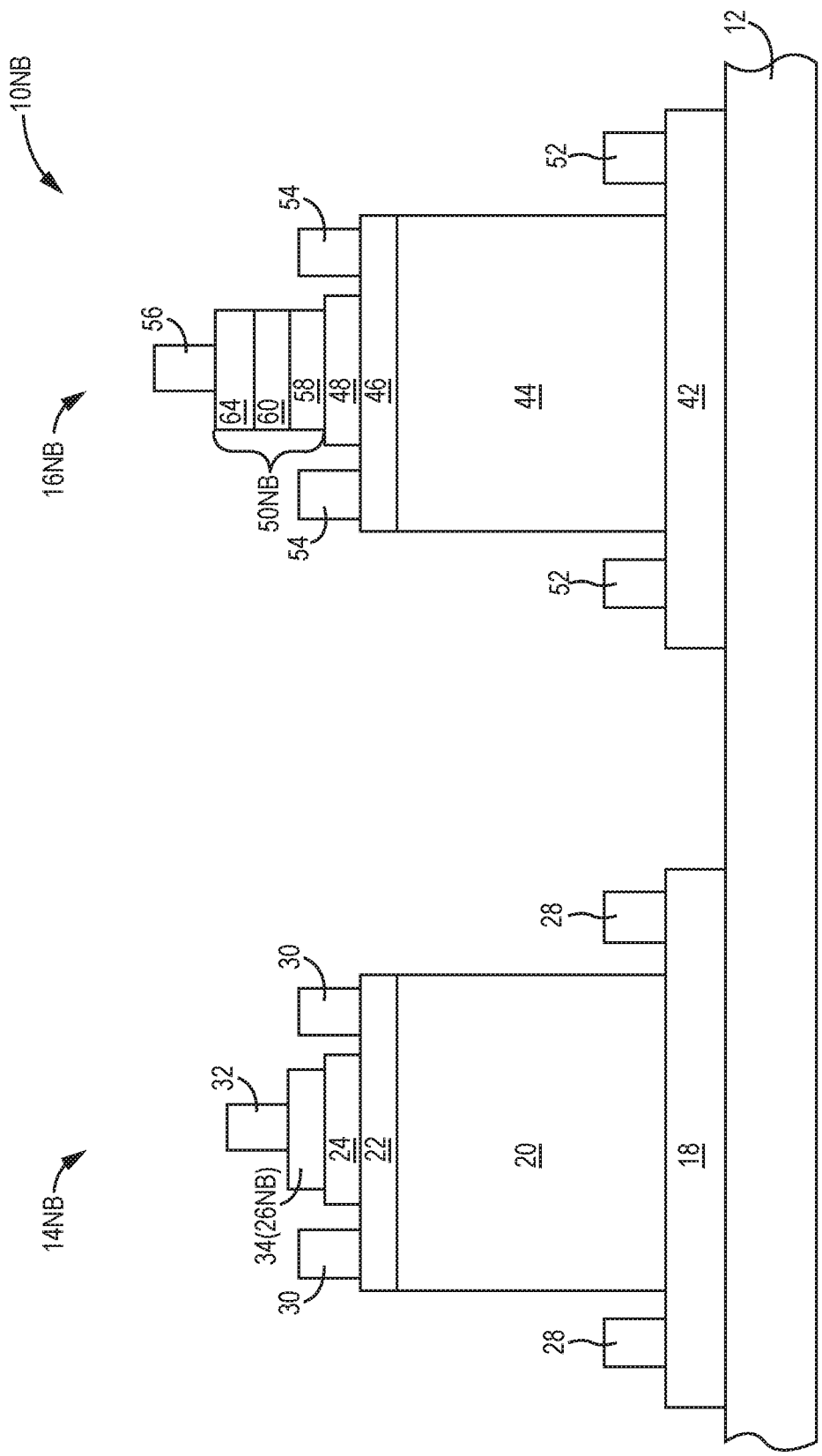
FIG. 4 shows an exemplary semiconductor device with multiple HBTs that have different emitter ballast resistances according to one embodiment of the present disclosure.
Figure 7A:
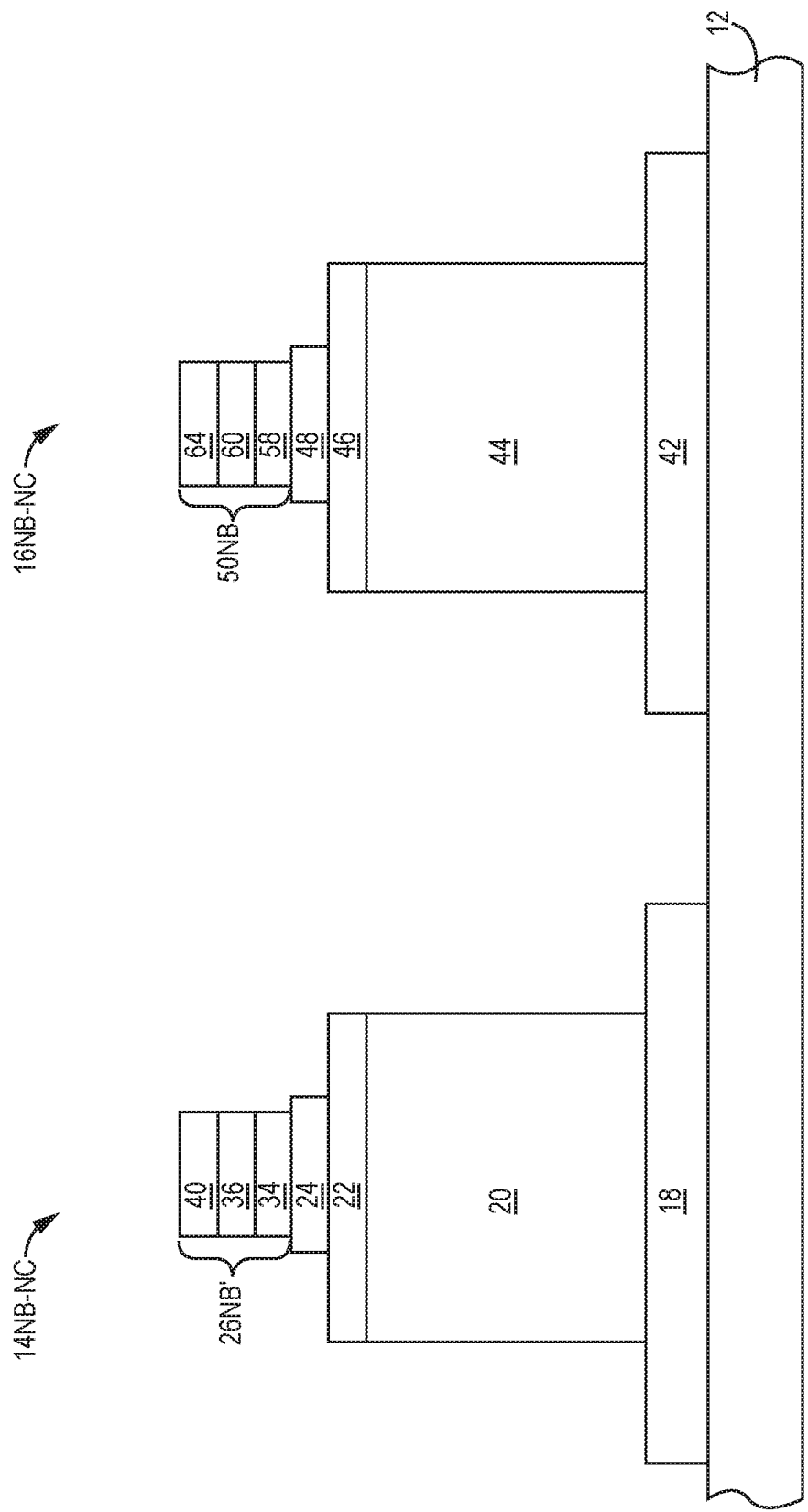
Figure 7B:
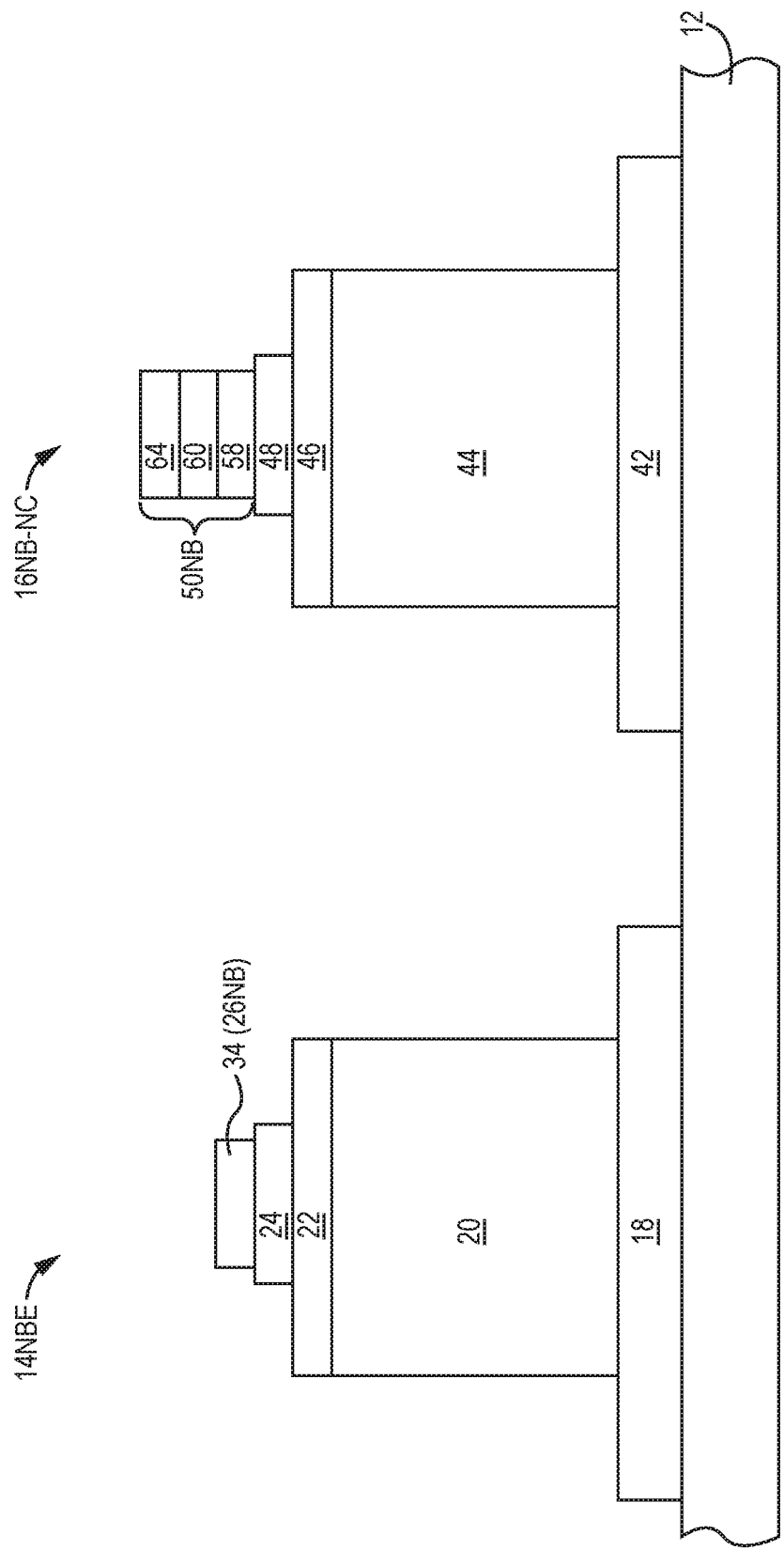
Figure 7C:
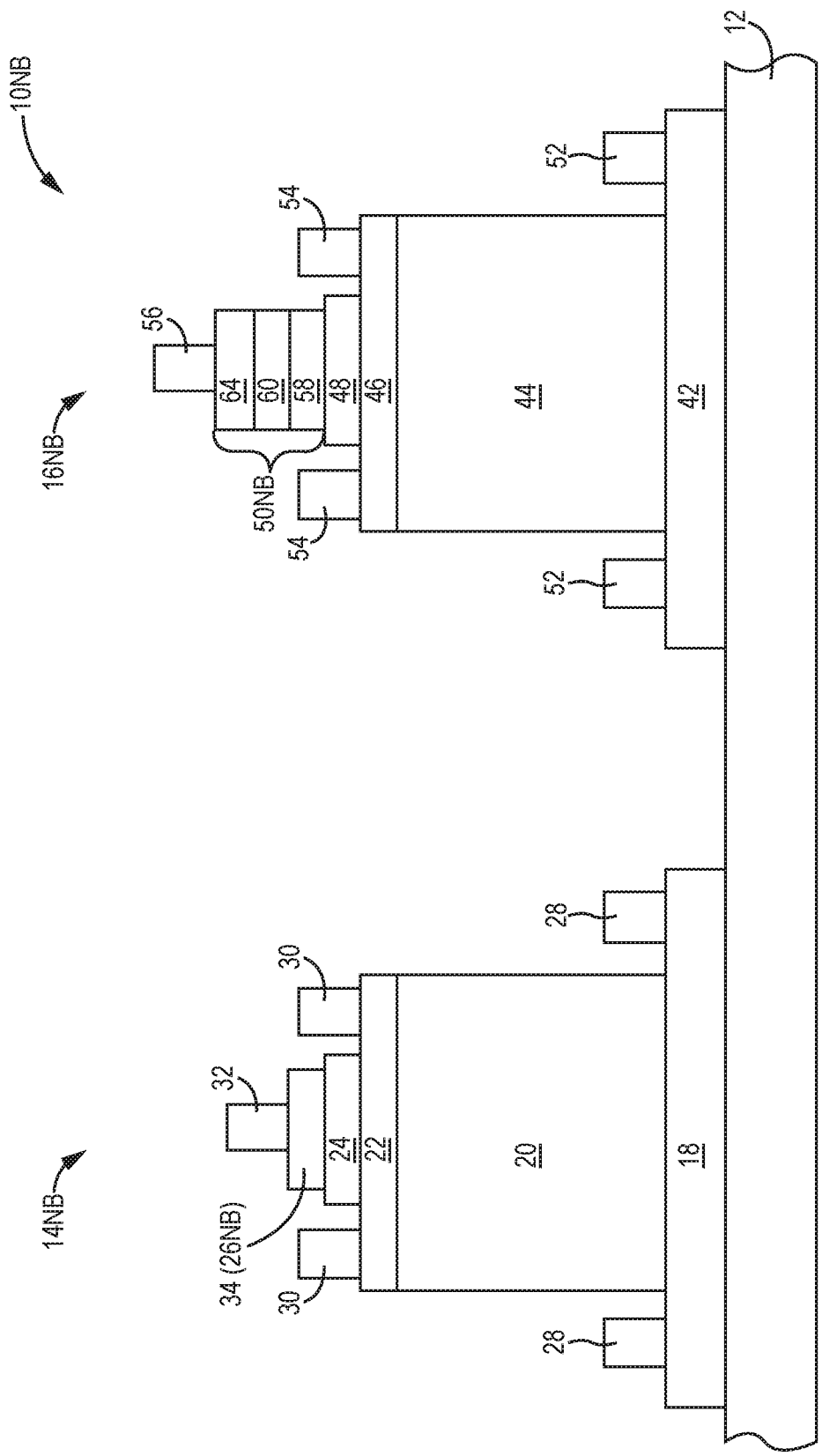

FIGS. 7A-7C provide exemplary steps that illustrate a process to fabricate the exemplary semiconductor device shown in FIG. 4.

It will be understood that for clear illustrations, FIGS. 2-7 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a semiconductor device with multiple heterojunction bipolar transistors (HBTs) that have different emitter ballast resistances and a process for making the same. FIG. 2 shows an exemplary semiconductor device 10 with multiple HBTs that have different emitter ballast resistances according to one embodiment of the present disclosure. For simplification, there are only two HBTs illustrated in the semiconductor package 10. In practical applications, the semiconductor package 10 may include 6 to 50 HBTs. Herein, the semiconductor package 10 includes a substrate 12, a first HBT 14 and a second HBT 16 formed over the substrate 12.

In detail, the substrate 12 may be semi-insulating and formed of Gallium-Arsenide (GaAs). The first HBT 14 includes a first subcollector 18, a first collector 20 formed over the first subcollector 18, a first base 22 formed over the first collector 20, a first emitter 24 formed over the first base 22, and a first cap structure 26 formed over the first emitter 24. In addition, a pair of first collector contacts 28 are formed over the first subcollector 18, a pair of first base contacts 30 are formed over the first base 22, and a first emitter contact 32 is formed over the first cap structure 26.

The first subcollector 18 may be formed from Gallium-Arsenide (GaAs) with a doping concentration between 1e18/$cm^3$ and 2e19/$cm^3$. The first collector 20 may be formed from GaAs with a doping concentration between 1e15/$cm^3$ and 2e17/$cm^3$. In different applications, both GaAs and Aluminum-Gallium-Arsenide (AlGaAs) may be used to form the first collector 20, and a gradient doping concentration may be used in the first collector 20 as well. The first base 22 may be formed from Gallium-Arsenide (GaAs) with a doping concentration between 7e18/$cm^3$ and 1e20/$cm^3$. The first emitter 24 may be formed from Indium-Gallium-Phosphide ($In_xGa_{1-x}P$) with a doping concentration between 5e16/$cm^3$ and 5e17/$cm^3$. Herein 'x' has a value between 0.4 and 0.6 representing relative quantities of respective elements. The first collector contacts 28, the first base collector contacts 30, and the first emitter contact 32 are formed from metals. The first subcollector 18 has a thickness between 5000 Å and 10000 Å, the first collector 20 has a thickness between 3000 Å and 12000 Å, the first base 22 has a thickness between 500 Å and 1600 Å, and the first emitter 24 has a thickness between 300 Å and 700 Å.

In this embodiment, the first cap structure 26 includes a first lower cap 34 formed over the first emitter 24, a first middle cap 36 formed over the first lower cap 34, a first ballast resistor layer 38 formed over the first middle cap 36, and a first upper cap 40 formed over the first ballast resistor layer 38. The first lower cap 34 may be formed from GaAs with a doping concentration between 1e17/$cm^3$ and 1e19/$cm^3$; the first middle cap 36 may be formed from GaAs compositionally graded into Indium-Gallium-Arsenide (InGaAs) from a bottom to a top of the first middle cap 36 with a doping concentration greater than 1e19/$cm^3$; and the first upper cap 40 may be formed from InGaAs with a doping concentration greater than 1e19/$cm^3$.

The first ballast resistor layer 38 may be formed from any lattice-match material to InGaAs with a wide bandgap. One exemplary material used in the first ballast resistor layer 38 is Indium-Aluminum-Arsenide ($In_{0.5}Al_{0.5}As$) (i.e., a mixture of approximately 50% Indium-Arsenide and 50% Aluminum-Arsenide). Another exemplary material used in the first ballast resistor layer 38 is Indium-Phosphide (InP). In addition, $In_yGa_{(1-y)}As$ with a different composition of $In_yAs$ and $Ga_{(1-y)}As$ than the first upper cap 40 may also be used in the first ballast resistor layer 38. Herein 'y' represents relative quantities of the Indium element. In this embodiment, 'y' having a value less than 0.5 may provide the first ballast resistor layer 38 a wider bandgap with additional constraints of engineering the composition and thickness to make the first ballast resistor layer 38 pseudomorphic. The first ballast resistor layer 38 is provided as an emitter ballast resistor integrated within the first HBT 14 between the first emitter 24 and the first emitter contact 32. A doping concentration of the first ballast resistor layer 38 is relatively low between $1e17/cm^3$ and $1e19/cm^3$, because the first ballast resistor layer 38 is used as a carrier (electrons/holes) barrier. The resistance of the first ballast resistor layer 38 may also be controlled by its thickness. In this embodiment, the first ballast resistor layer 38 has a thickness between 10 Å and 1500 Å.

The second HBT 16 has a similar configuration to the first HBT 14. The second HBT 16 includes a second subcollector 42, a second collector 44 formed over the second subcollector 42, a second base 46 formed over the second collector 44, a second emitter 48 formed over the second base 46, and a second cap structure 50 formed over the second emitter 48. In addition, a pair of second collector contacts 52 are formed over the second subcollector 42, a pair of second base contacts 54 are formed over the second base 46, and a second emitter contact 56 is formed over the second cap structure 50.

The first subcollector 18 and the second subcollector 42 may be formed from a common subcollector layer, the first collector 20 and the second collector 44 may be formed from a common collector layer, the first base 22 and the second base 46 may be formed from a common base layer, and the first emitter 24 and the second emitter 48 may be formed from a common emitter layer. Herein, forming from a common (subcollector/collector/base/emitter) layer refers to forming from a common epitaxial layer with a same material composition, a same doping concentration, and a same thickness, which may be broken into discontinuous segments during fabrication. In some applications, the common subcollector layer is a contiguous subcollector layer (not shown).

The second cap structure 50 is different from the first cap structure 26 and includes a second lower cap 58 and a second middle cap 60 without a ballast resistor layer. The second lower cap 58 may be formed from GaAs with a doping concentration between $1e17/cm^3$ and $1e19/cm^3$; and the second middle cap 60 may be formed from GaAs compositionally graded into InGaAs from a bottom to a top of the second middle cap 60 with a doping concentration greater than $1e19/cm^3$. The first lower cap 34 and the second lower cap 58 may be formed from a common lower cap layer, and the first middle cap 36 and the second middle cap 60 may be formed from a common middle cap layer. Herein, forming from a common (lower/middle) cap layer refers to forming from a common epitaxial layer with a same material composition, a same doping concentration, and a same thickness, which may be broken into discontinuous segments during fabrication.

Because the first cap structure 26 includes the first ballast resistor layer 38, which is used as a carrier (electrons/holes) barrier, and the second cap structure 50 does not include a ballast resistor layer, a first emitter ballast resistance from the first cap structure 26 is at least 1.5 times greater than a second emitter ballast resistance from the second cap structure 50. The chosen first emitter ballast resistance is dependent on the specific application in which the first HBT 14 is used. The first emitter ballast resistance is formed between the first emitter 24 and the first emitter contact 32, and the second emitter ballast resistance is formed between the second emitter 48 and the second emitter contact 56.

In order to get a relatively low emitter ballast resistance compared to the first emitter ballast resistance of the first HBT 14, another configuration of a second HBT 16L is provided as illustrated in FIG. 3. The second HBT 16L has a similar configuration to the first HBT 14. The second HBT 16L includes a second cap structure 50L, which includes the second lower cap 58, the second middle cap 60, a second ballast resistor layer 62, and a second upper cap 64. The second ballast resistor layer 62 may be formed from the same material composition with the same doping concentration and thickness as the first ballast resistor layer 38. The second upper cap 64 and the first upper cap 40 may be formed from a common upper cap layer. Herein, forming from a common upper cap layer refers to forming from a common epitaxial layer with a same material composition, a same doping concentration, and a same thickness, which may be broken into discontinuous segments during fabrication.

The difference from the first HBT 14 is that the second HBT 16L includes a lengthened second emitter contact 56L, which is not formed over the second cap structure 50L, but extends through the second upper cap 64 and the second ballast resistor layer 62, and extends into the second middle cap 60. Because the lengthened second emitter contact 56L is formed from an alloyed metal, the second upper cap 64 and the second ballast resistor layer 62 are shorted. As such, the first emitter ballast resistance of the first HBT 14 between the first emitter 24 and the first emitter contacts 32 is at least 1.5 times greater than a second emitter ballast resistance of the second HBT 16L between the second emitter 48 and the lengthened second emitter contact 56L.

FIG. 4 shows another exemplary semiconductor device 10NB with multiple HBTs that have different emitter ballast resistances according to one embodiment of the present disclosure. The semiconductor package 10NB includes the substrate 12, a first HBT 14NB and a second HBT 16NB formed over the substrate 12, where neither the first HBT 14NB nor the second HBT 16NB includes a ballast resistor layer.

The first HBT 14NB includes the first subcollector 18, the first collector 20 formed over the first subcollector 18, the first base 22 formed over the first collector 20, the first emitter 24 formed over the first base 22, and a first cap structure 26NB formed over the first emitter 24. Herein, the first cap structure 26NB only includes the first lower cap 34. In addition, the first collector contacts 28 are formed over the first subcollector 18, the first base contacts 30 are formed over the first base 22, and the first emitter contact 32 is formed over the first lower cap 34.

The second HBT 16NB has a similar configuration to the first HBT 14NB. The difference from the first HBT 14NB is that the second HBT 16NB has a second cap structure 50NB, which includes the second lower cap 58 formed over the second emitter 48, the second middle cap 60 formed over the second lower cap 58, and the second upper cap 64 formed over the second middle cap 60 without a ballasted resistor layer. The second emitter contact 56 is formed over the second cap structure 50NB and in contact with the second upper cap 64. Herein, the second lower cap 58 may be formed from a common lower cap layer as the first lower cap 34. Forming from a common lower cap layer refers to forming from a common epitaxial layer with a same material composition, a same doping concentration, and a same thickness, which may be broken into discontinuous segments during fabrication. The second middle cap 60 and second upper cap 64 may be comprised of a superlattice structure.

The first cap structure 26NB has a higher contact resistance than the second cap 50NB because the second lower cap 58 (the first lower cap 34) is designed to have a higher contact resistance than the second upper cap 64 due to lower doping concentration and a different material composition from the second upper cap 64. In addition, the second middle cap 60 and second upper cap 64 may be comprised of the superlattice structure, which is designed to give a low contact resistance to the second emitter cap 50NB. As such, a first emitter ballast resistance of the first HBT 14NB between the first emitter 24 and the first emitter contact 32 is at least 1.5 times greater than a second emitter ballast resistance of the second HBT 16NB between the second emitter 48 and the second emitter contact 56.

FIGS. 5A-5C provide exemplary steps that illustrate a process to fabricate the exemplary semiconductor device 10 shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 5A-5C.

Initially, a first no-contact HBT 14NC and a second no-contact HBT 16NC formed over the substrate 12 are provided as depicted in FIG. 5A. The first no-contact HBT 14NC includes the first subcollector 18, the first collector 20 formed over the first subcollector 18, the first base 22 formed over the first collector 20, the first emitter 24 formed over the first base 22, and the first cap structure 26 formed over the first emitter 24. The first cap structure 26 includes the first lower cap 34 formed over the first emitter 24, the first middle cap 36 formed over the first lower cap 34, the first ballast resistor layer 38 formed over the first middle cap 36, and the first upper cap 40 formed over the first ballast resistor layer 38.

The second no-contact HBT 16NC has a similar configuration to the first no-contact HBT 14NC. The second no-contact HBT 16NC includes the second subcollector 42, the second collector 44 formed over the second subcollector 42, the second base 46 formed over the second collector 44, the second emitter 48 formed over the second base 46, and a second before-etching cap structure 50' formed over the second emitter 48. The second before-etching cap structure 50' includes the second lower cap 58 formed over the second emitter 48, the second middle cap 60 formed over the second lower cap 58, the second ballast resistor layer 62 formed over the second middle cap 60, and the second upper cap 64 formed over the second ballast resistor layer 62. Herein, the second ballast resistor layer 62 may be formed from any lattice-match material to InGaAs with a wide bandgap. The second ballast resistor layer 62 may be formed of $In_{0.5}Al_{0.5}As$, InP or $In_yGa_{(1-y)}As$ and used as an etch stop layer in a later step.

Next, the second upper cap 64 and the second ballast resistor layer 62 are removed from the second no-contact HBT 16NC to form a second etched HBT 16E as depicted in FIG. 5B. The second lower cap 58 and the second middle cap 60 are included in the second cap structure 50 of the second etched HBT 16E. A wet/dry etchant chemistry, such as potassium hydroxide (KOH), sodium hydroxide (NaOH), and acetylcholine (ACH), may be used to remove the second upper cap 64 and the second ballast resistor layer 62.

Finally, the first collector contacts 28, the first base contacts 30, and the first emitter contact 32 are provided to the first no-contact HBT 14NC to form the first HBT 14, and the second collector contacts 52, the second base contacts 54, and the second emitter contact 56 are provided to the second etched HBT 16E to form the second HBT 16 as depicted in FIG. 5C. For the first HBT 14, the first collector contacts 28 are formed over the first subcollector 18, the first base contacts 30 are formed over the first base 22, and the first emitter contact 32 is formed over the first upper cap 40 of the first cap structure 26. For the second HBT 16, the second collector contacts 52 are formed over the second subcollector 42, the second base contacts 54 are formed over the second base 46, and the second emitter contact 56 is formed over the second middle cap 60 of the second cap structure 50.

FIGS. 6A-6D provide exemplary steps that illustrate a process to fabricate the exemplary semiconductor device 10L shown in FIG. 3. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 6A-6D.

Figure 6A:
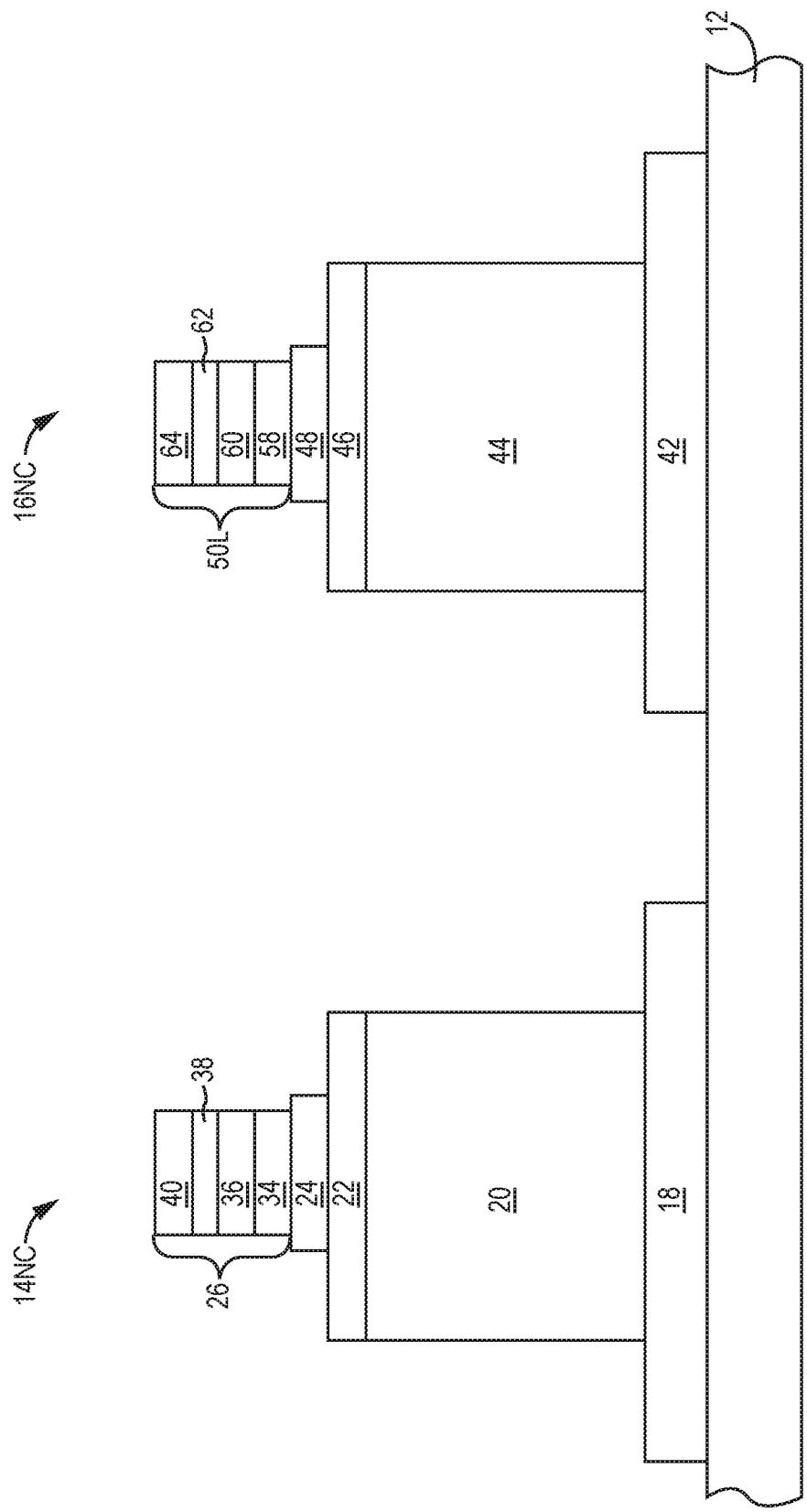

Initially, a first no-contact HBT 14NC and a second no-contact HBT 16NC formed over the substrate 12 are provided as depicted in FIG. 6A. The first no-contact HBT 14NC includes the first subcollector 18, the first collector 20 formed over the first subcollector 18, the first base 22 formed over the first collector 20, the first emitter 24 formed over the first base 22, and the first cap structure 26 formed over the first emitter 24. The first cap structure 26 includes the first lower cap 34 formed over the first emitter 24, the first middle cap 36 formed over the first lower cap 34, the first ballast resistor layer 38 formed over the first middle cap 36, and the first upper cap 40 formed over the first ballast resistor layer 38.

The second no-contact HBT 16NC has a similar configuration to the first no-contact HBT 14NC. The second no-contact HBT 16NC includes the second subcollector 42, the second collector 44 formed over the second subcollector 42, the second base 46 formed over the second collector 44, the second emitter 48 formed over the second base 46, and the second cap structure 50L formed over the second emitter 48. The second cap structure 50L includes the second lower cap 58 formed over the second emitter 48, the second middle cap 60 formed over the second lower cap 58, the second ballast resistor layer 62 formed over the second middle cap 60, and the second upper cap 64 formed over the second ballast resistor layer 62. Herein, the second ballast resistor layer 62 may be formed from any lattice-match material to InGaAs with a wide bandgap. The second ballast resistor layer 62 may have a low doping concentration between $1e17/cm^3$ and $1e19/cm^3$, and be formed of $In_{0.5}Al_{0.5}As$, InP or $In_yGa_{(1-y)}As$. Herein, 'y' represents relative quantities of Indium element. In this embodiment, 'y' having a value less than 0.5 may provide the second ballast resistor layer 62 a wider bandgap with additional constraints of engineering the composition and thickness to make the second ballast resistor layer 62 pseudomorphic.

Figure 6B:
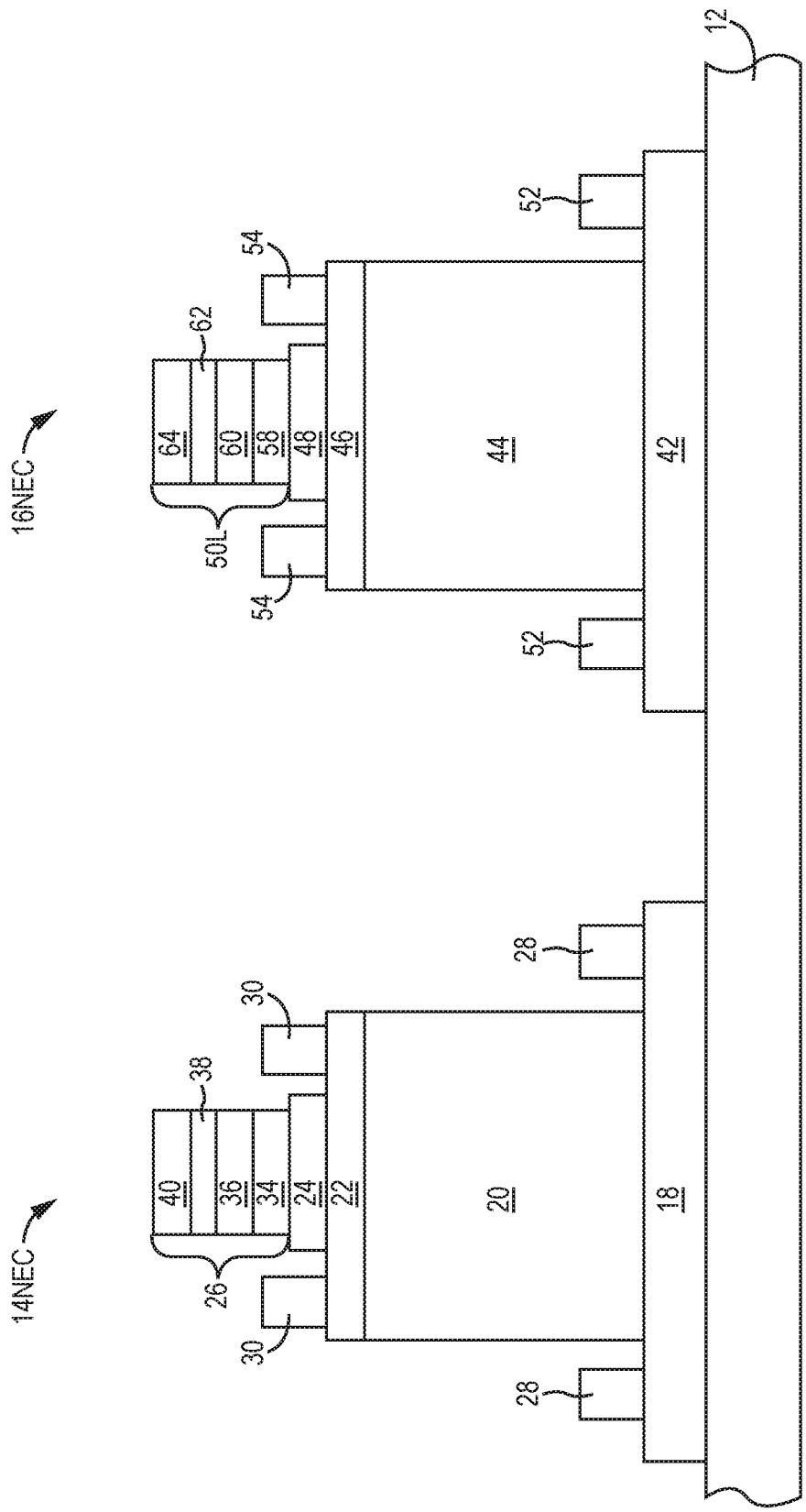
Figure 6C:
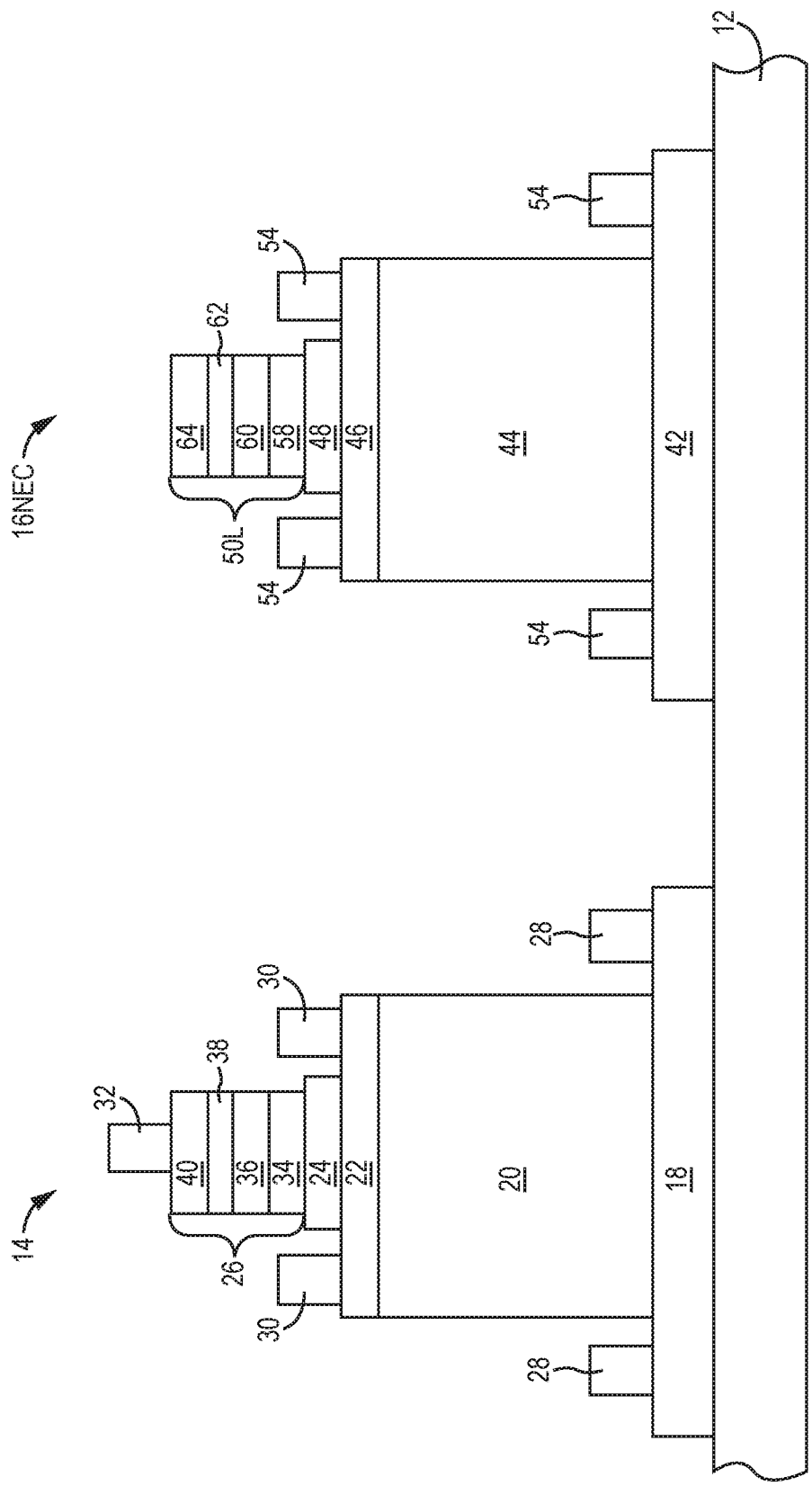

Next, the first collector contacts 28 and the first base contacts 30 are provided to the first no-contact HBT 14NC to form a first no-emitter-contact HBT 14NEC, and the second collector contacts 52 and the second base contacts 54 are provided to the second no-contact HBT 16NC to form a second no-emitter-contact HBT 16NEC as depicted in FIG. 6B. The first collector contacts 28 are formed over the first subcollector 18, and the first base contacts 30 are formed over the first base 22. The second collector contacts 52 are formed over the second subcollector 42, and the second base contacts 54 are formed over the second base 46. The first emitter contact 32 is provided to the first no-emitter-contact HBT 14NEC to form the first HBT 14 as depicted in FIG. 6C. The emitter contact 32 is formed over the upper cap 40 of the first HBT 14.

Figure 6D:
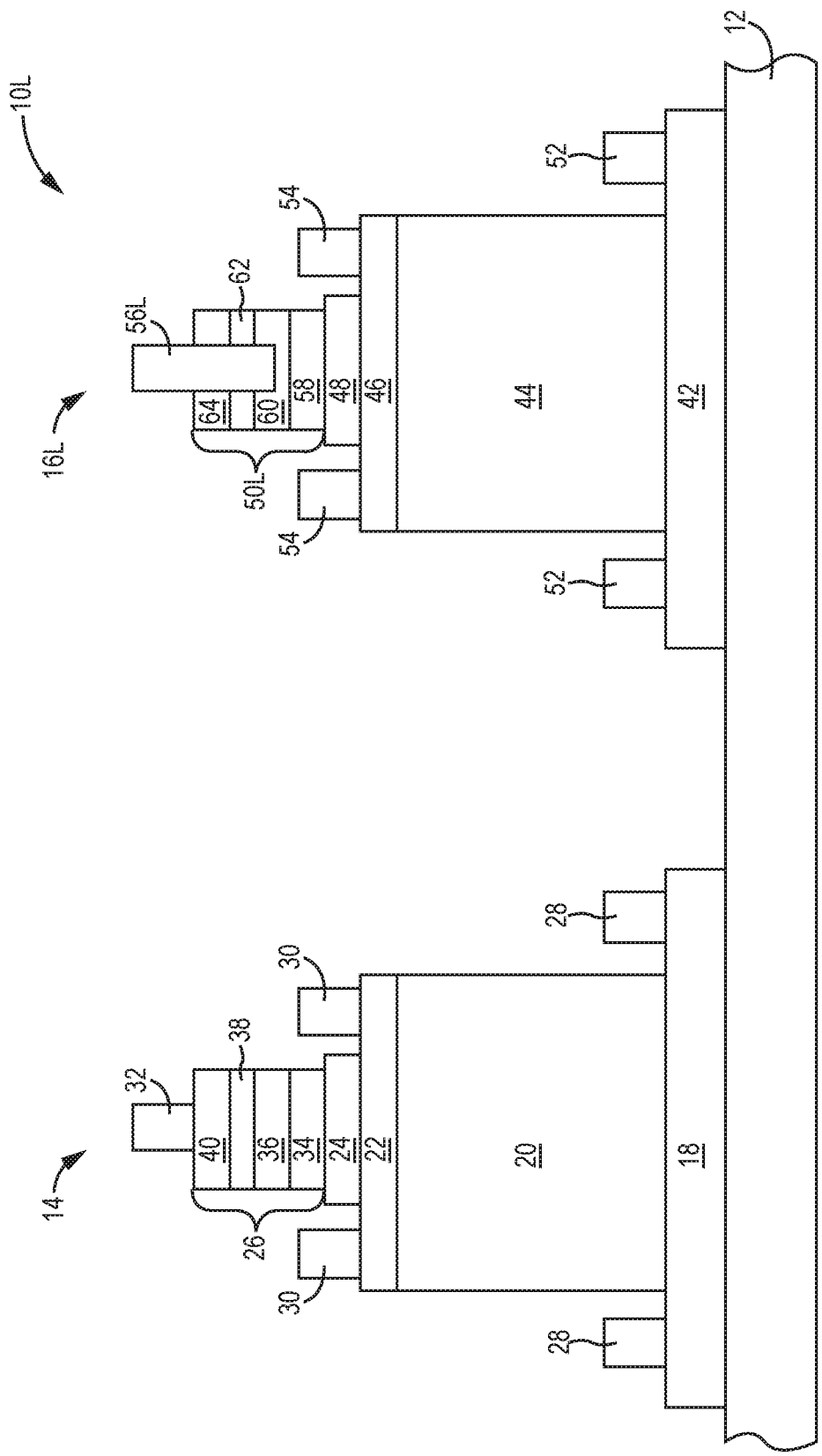

Finally, the lengthened second emitter contact 56L is provided to the second no-emitter-contact HBT 16NEC to form the second HBT 16L as depicted in FIG. 6D. The lengthened second emitter contact 56L extends through the second upper cap 64 and the second ballast resistor layer 62 of the second cap structure 50L, and extends into the second middle cap 60. The lengthened second emitter contact 56L may be formed from alloyed metal such that the second upper cap 64 and the second ballast resistor layer 62 are shorted, and the resistances from the second upper cap 64 and the second ballast resistor layer 62 are substantially eliminated. The lengthened second emitter contact 56L may be provided by an alloying process. Alternatively, a trench may be etched by a wet or dry chemistry to reach into the second middle cap 60, and then the lengthened second emitter contact 56L is placed into the trench.

FIGS. 7A-7C provide exemplary steps that illustrate a process to fabricate the exemplary semiconductor device 10NB shown in FIG. 4. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 7A-7C.

Initially, a first no-contact HBT 14NB-NC and a second no-contact HBT 16NB-NC formed over the substrate 12 are provided as depicted in FIG. 7A. The first no-contact HBT 14NB-NC includes the first subcollector 18, the first collector 20 formed over the first subcollector 18, the first base 22 formed over the first collector 20, the first emitter 24 formed over the first base 22, and a first before-etching cap structure 26NB' formed over the first emitter 24. The first before-etching cap structure 26NB' includes the first lower cap 34 formed over the first emitter 24, the first middle cap 36 formed over the first lower cap 34, and the first upper cap 40 formed over the first middle cap 40. Notice that there is no ballast resistor layer inside the first before-etching cap structure 26NB'. The first middle cap 36 may be formed from GaAs compositionally graded into Indium-Gallium-Arsenide (InGaAs) from a bottom to a top of the first middle cap 36 and may be used as an etched stop layer in a later step.

The second no-contact HBT 16NB-NC has a similar configuration to the first no-contact HBT 14NB-NC. The second no-contact HBT 16NB-NC includes the second subcollector 42, the second collector 44 formed over the second subcollector 42, the second base 46 formed over the second collector 44, the second emitter 48 formed over the second base 46, and the second cap structure 50NB formed over the second emitter 48. The second cap structure 50NB includes the second lower cap 58 formed over the second emitter 48, the second middle cap 60 formed over the second lower cap 58, and the second upper cap 64 formed over the second middle cap 60. There is no ballast resistor layer inside the second cap structure 50NB.

Next, the first upper cap 40 and the first middle cap 36 are removed from the first no-contact HBT 14NB-NC to form a first etched HBT 14NBE as depicted in FIG. 7B. The first lower cap 34 is included in the first cap structure 26NB of the first etched HBT 14NBE. A wet/dry etchant chemistry, such as KOH, NaOH, and ACH, may be used to remove the first upper cap 40 and the first middle cap 36. Because the first middle cap 36 and the first upper cap 40 are highly doped with a doping concentration greater than 1e19/cm$^3$, the first lower cap 34 alone has a higher contact resistance than the first before-etching cap structure 26NB', which combines the first lower cap 34, the first middle cap 36, and the first upper cap 40. Further, because the first lower cap 34 and the second lower cap 58 may be formed from a common lower cap layer, the first middle cap 36 and the second middle cap 60 may be formed from a common middle cap layer, and the first upper cap 40 and the second upper cap 64 may be formed from a common upper cap layer, the first lower cap 34 alone may have a higher contact resistance than the second cap structure 50NB, which combines the second lower cap 58, the second middle cap 60, and the second upper cap 64.

Finally, the first collector contacts 28, the first base contacts 30, and the first emitter contact 32 are provided to the first etched HBT 14NBE to form the first HBT 14NB, and the second collector contacts 52, the second base contacts 54, and the second emitter contact 56 are provided to the second no-contact HBT 16NB-NC to form the second HBT 16NB as depicted in FIG. 7C. For the first HBT 14, the first collector contacts 28 are formed over the first subcollector 18, the first base contacts 30 are formed over the first base 22, and the first emitter contact 32 is formed over the first lower cap 34 of the first cap structure 26NB. For the second HBT 16, the second collector contacts 52 are formed over the second subcollector 42, the second base contacts 54 are formed over the second base 46, and the second emitter contact 56 is formed over the second upper cap 64 of the second cap structure 50NB.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a first no-contact heterojunction bipolar transistor (HBT) and a second no-contact HBT formed over a substrate, wherein:
      the first no-contact HBT comprises a first lower cap over a first emitter, a first middle cap over the first lower cap, and a first upper cap over the first middle cap at a top portion of the first no-contact HBT; and
      the second no-contact HBT comprises a second lower cap over a second emitter, a second middle cap over the second lower cap, and a second upper cap over the second middle cap at a top portion of the second no-contact HBT;
   removing the first upper cap and the first middle cap from the first no-contact HBT to form a first etched HBT;
   providing a first emitter contact to the first etched HBT to form a first HBT, wherein the first emitter contact is formed over the first lower cap; and
   providing a second emitter contact to the second no-contact HBT to form a second HBT, wherein the second emitter contact is formed over the second upper cap.

2. The method of claim 1 wherein the second middle cap and second upper cap are comprised of a superlattice structure.

3. The method of claim 1 wherein a first emitter ballast resistance between the first emitter and the first emitter contact is at least 1.5 times greater than a second emitter ballast resistance between the second emitter and the second emitter contact.

4. The method of claim 1 wherein the first lower cap and the second lower cap are formed from a common lower cap layer.

5. The method of claim 1 wherein:
the first no-contact HBT further comprises a first collector and a first base formed over the first collector, wherein the first emitter is formed over the first base; and
the second no-contact HBT further comprises a second collector and a second base formed over the second collector, wherein the second emitter is formed over the second base.

6. The method of claim 5 wherein the first collector and the second collector are formed from a common collector layer, the first base and the second base are formed from a common base layer, and the first emitter and the second emitter are formed from a common emitter layer.

7. The method of claim 5 wherein:
the first no-contact HBT and the second no-contact HBT share a common substrate;
the first no-contact HBT further comprises a first subcollector between the substrate and the first collector; and
the second no-contact HBT further comprises a second subcollector between the substrate and the second collector.

8. The method of claim 7 wherein the first subcollector and the second subcollector are formed from a common subcollector layer.

9. The method of claim 7 further comprising
providing first collector contacts and first base contacts to the first etched HBT, wherein the first collector contacts are formed over the first subcollector and the first base contacts are formed over the first base; and
providing second collector contacts and second base contacts to the second no-contact HBT, wherein the second collector contacts are formed over the second subcollector and the second base contacts are formed over the second base.

10. The method of claim 1 wherein:
the first lower cap and the second lower cap comprise Gallium-Arsenide with a doping concentration between $1e17/cm^3$ and $1e19/cm^3$;
the second middle cap comprises Gallium-Arsenide compositionally graded into Indium-Gallium-Arsenide with a doping concentration greater than $1e19/cm^3$; and
the second upper cap comprises Indium-Gallium-Arsenide with a doping concentration greater than $1e19/cm^3$.

* * * * *